United States Patent [19]

Mastandrea, Jr. et al.

[11] Patent Number: 5,783,943
[45] Date of Patent: Jul. 21, 1998

[54] METHOD AND APPARATUS FOR POSITIONING AN INSERT GRADIENT COIL WITHIN AN EXAMINATION REGION OF A MAGNETIC RESONANCE IMAGING APPARATUS

[76] Inventors: Nicholas J. Mastandrea, Jr., 730 E. 254th St., Euclid, Ohio 44117; Mark A. Richard, 3743 Bridgeview, S. Euclid, Ohio 44121

[21] Appl. No.: 758,226

[22] Filed: Nov. 27, 1996

[51] Int. Cl.$^6$ ............................................. G01V 3/00
[52] U.S. Cl. ................................. 324/318; 324/322
[58] Field of Search ........................ 324/318, 322, 324/314, 312, 307, 309; 128/653.5

[56] References Cited

U.S. PATENT DOCUMENTS

| | | | |
|---|---|---|---|
| 5,278,504 | 1/1994 | Patrick et al. | 324/318 |
| 5,293,126 | 3/1994 | Schaefer | 324/318 |
| 5,311,134 | 5/1994 | Yamagata et al. | 324/318 |
| 5,485,087 | 1/1996 | Morich et al. | 324/318 |
| 5,497,089 | 3/1996 | Lampman et al. | 324/318 |
| 5,600,245 | 2/1997 | Yamamoto et al. | 324/318 |

*Primary Examiner*—Louis M. Arana
*Attorney, Agent, or Firm*—Fay, Sharpe, Beall, Fagan, Minnich & McKee

[57] ABSTRACT

A trolley cage (58) selectively positions an insert gradient coil (56) along a patient beam (38) of a magnetic resonance apparatus (A). The trolley cage (58) includes a lower cage assembly (62) surrounding a first exterior surface portion of the insert gradient coil (56), an upper cage assembly (60) removably secured to the lower cage assembly (62) and surrounding a second exterior surface portion of the insert gradient coil (56), and a number of wheels (90) secured to the lower cage assembly (62) for permitting the trolley cage (58) to roll along a patient beam (38) extending through an examination region of the magnetic resonance imaging apparatus (A). The trolley cage (58) also includes a number of pneumatic latching mechanisms (92) for locking the trolley cage (58) to the patient beam (38) when the insert gradient coil (56) is positioned at isocenter. An interlock mechanism (96, 110-116) is provided which enables the imaging systems of the magnetic resonance imaging apparatus to operate only when the trolley cage is properly locked to the patient beam.

20 Claims, 6 Drawing Sheets

METHOD AND APPARATUS FOR POSITIONING AN INSERT GRADIENT COIL WITHIN AN EXAMINATION REGION OF A MAGNETIC RESONANCE IMAGING APPARATUS

BACKGROUND OF THE INVENTION

The present invention relates to the magnetic resonance arts. It finds particular application in conjunction with medical magnetic resonance imaging systems and will be described with particular reference thereto. It is to be appreciated, however, that the invention will also find application in conjunction with other types of magnetic resonance imaging systems, magnetic resonance spectroscopy systems, and the like.

In magnetic resonance imaging applications, a 3-axis gradient coil set is used to provide spacial encoding of the NMR signal. Insert gradient coils are coils which temporarily reside inside a whole body gradient coil and are intended to be installed or removed as patient imaging needs dictate. The performance advantages of insert gradient coils over whole body gradient coils has been well established (see, for instance, U.S. Pat. No. 5,278,504 of Patrick et al.). While much work has been done in modeling and building insert gradient coils, very little has been done to address the practical issues of inserting and removing such a gradient coil from an MRI system.

The simplest but crudest method of inserting or removing an insert gradient coil from the bore of an MRI system is brute force. The operator lifts the insert gradient coil up into the bore and then slides it to isocenter. Unfortunately, the brute force method requires one or more strong persons to lift the insert gradient coil onto the patient beam and to man-handle the insert gradient coil to isocenter. This method becomes nearly impossible when higher power insert gradient coils are used. Such insert gradient coils can weigh up to 100 kg or more. A second disadvantage of the brute force method is that once in position, there is nothing to prevent the insert gradient coil from moving under the torques generated by the applied gradient pulses during scans.

A second method of positioning an insert gradient coil at isocenter is to lift the insert gradient coil directly onto the patient couch and then use the horizontal drive motor of the patient couch to position the insert gradient coil at isocenter. The disadvantages of positioning an insert gradient coil on the patient couch are like those of the brute force method. It requires that the insert gradient coil be manually lifted on and off the patient couch. Likewise, it is difficult to prevent the insert gradient coil from moving during scans. Although straps could be used to tie the coil down, this is a crude and cumbersome procedure.

Yet another method of positioning an insert gradient coil is to use wooden or other non-magnetic lifting jacks on wheels. The insert gradient coil is first positioned on the patient beam at either the front (patient end) or rear of the magnet and then lifted up by the lifting jacks and rolled to isocenter. This method requires that the insert gradient coil be lifted onto the patient beam and that the lifting jacks be positioned properly on the insert gradient coil for every insertion and removal. This method can be refined slightly through the use of a wooden or other non-magnetic cart. The cart is constructed with a height which matches the height of the patient beam. The insert gradient coil can then be rolled directly on to and off of the cart, thus eliminating the need to lift the insert gradient coil.

Further, a non-metallic lifting trolley may be rolled beneath the insert gradient coil and cranked so that the insert gradient coil is lifted slightly and can be rolled out from isocenter. The lifting trolley is positioned beneath the insert gradient coil only for insertion and removal of the insert gradient coil. The disadvantages of a lifting trolley are three fold. First, during insert gradient coil removal, it requires that the user reach or crawl into the bore to attach or insert the lifting trolley. Second, it either requires that the insert gradient coil be lifted on and off the patient beam or that an external cart be made available. Finally, as in the other methods, no means for preventing the insert gradient coil from moving during scans is provided.

The present invention contemplates a new and improved method and apparatus for positioning an insert gradient coil within a bore of an MRI apparatus which overcomes the above-mentioned problems and others.

SUMMARY OF THE INVENTION

In accordance with the present invention, a trolley cage is provided for constraining an insert gradient coil on a patient beam of a magnetic resonance apparatus. The trolley cage includes a cage assembly locked to an exterior surface portion of the insert gradient coil, a number of wheels secured to the cage assembly for permitting the trolley cage to roll along the patient beam, and a latching mechanism for locking the cage assembly to the patient beam.

In accordance with another aspect of the present invention, a magnetic resonance imaging apparatus includes a main magnetic field mechanism for generating a magnetic field through an examination region, a patient beam extending through the examination region, and an insert gradient coil assembly positioned on the patient beam. The insert gradient coil assembly includes a trolley cage for constraining an insert gradient coil therein. The trolley cage includes a cage assembly surrounding an exterior surface portion of the insert gradient coil, a number of wheels secured to the cage assembly for permitting the trolley cage to roll along the patient beam, and a latching mechanism for locking the cage assembly to the patient beam when the trolley cage is positioned within the examination region.

One advantage of the present invention is that it permits an insert gradient coil to be inserted or removed from a bore of an MRI device by a single person with no lifting or man-handling.

Another advantage of the present invention is that it eliminates the need for a cart or other facility for storing insert gradient coils.

Yet another advantage of the present invention is that vibration is decreased during use because the insert gradient coil is isolated from mounting points and from the patient.

Still another advantage of the present invention is that it increases safety by providing latches which prevent the insert gradient coil from moving during a scan.

A further advantage of the present invention resides in increased safety. A pneumatic interlock system which prevents accidental operation of the MRI system except when the insert gradient coil is positioned at isocenter. No electrical wires extend into the bore to control the interlock.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components and in various steps and

3 arrangement of steps. The drawings are only for purposes of illustrating a preferred embodiment and are not to be construed as limiting the invention.

DETAILED DESCRIPTION OF THE PREFERRED EMBODIMENTS

Figure 1:
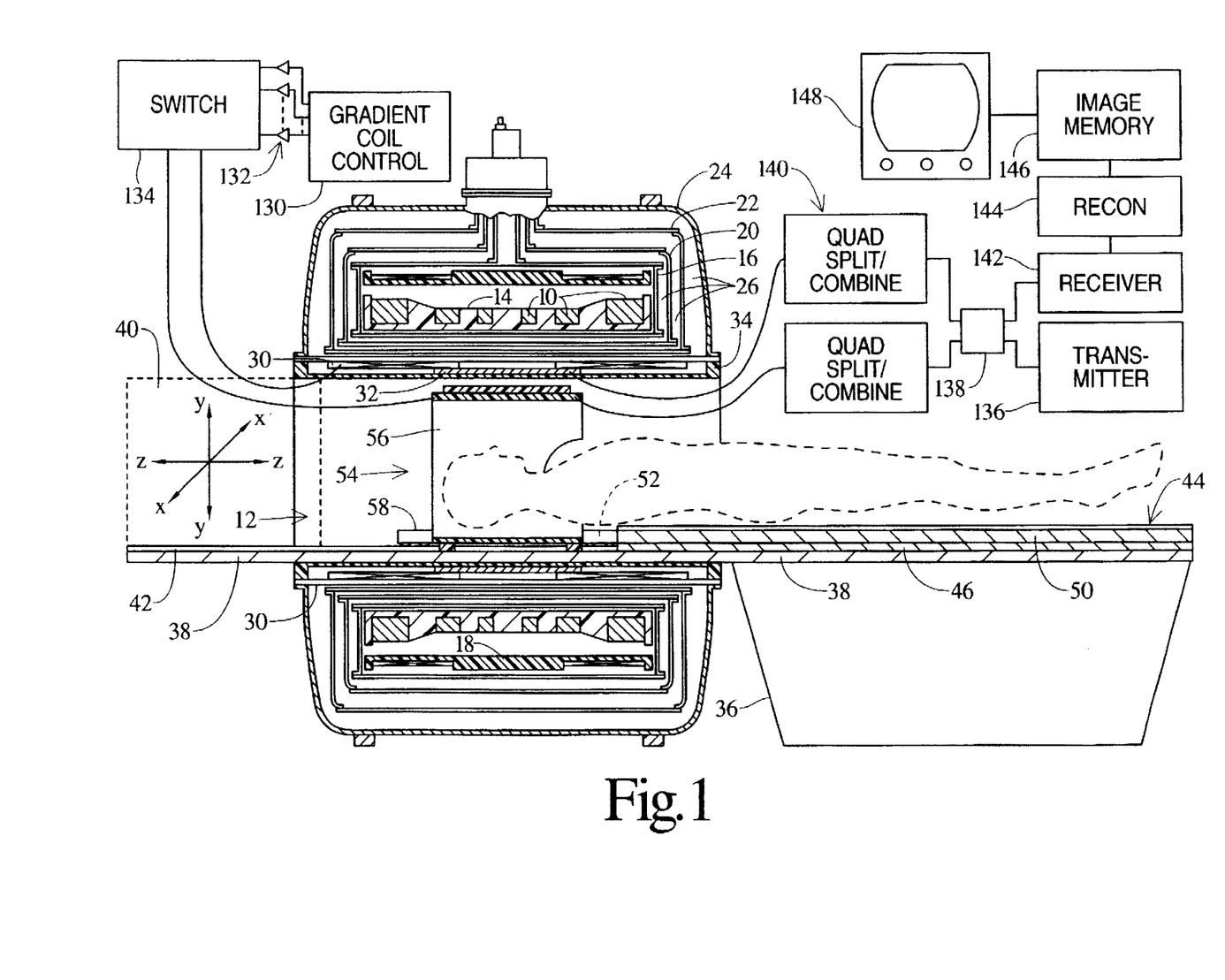
FIG. 1 is a vertical cross-sectional view of a super conducting magnetic resonance imaging (MRI) apparatus which incorporates the features of the present invention therein.

With reference to FIG. 1, an MRI apparatus A includes a plurality of super conducting main magnetic fields coils 10 which generate a temporally constant magnetic field along a longitudinal or Z-axis of a central bore 12. The main magnetic field coils 10 are mounted on a dielectric former 14 and received in an annular, helium vessel 16. The helium vessel 16 is filled with liquid helium to maintain the super conducting main magnetic field coils 10 at their super conducting temperature. A main magnetic field shield coil assembly 18 generates a magnetic field which opposes the fields generated by the main magnetic field coils 10 in regions surrounding the main magnetic field coils 10. Optionally, resistive magnets can also be used.

The helium vessel 16 is surrounded by a first cold shield assembly 20, a second cold shield assembly 22 and an outer vacuum vessel 24. Layers of Mylar (not shown) are arranged between the vacuum vessel 24, the first and second cold shield assemblies 20, 22, and the helium vessel 16.

A circularly cylindrical, whole body gradient coil assembly 30 is mounted on a circularly cylindrical dielectric former and mounted within the bore 12. A circularly cylindrical, whole body RF coil 32 is mounted on a circularly cylindrical dielectric former and mounted within the bore 12. A circularly cylindrical dielectric cosmetic sleeve 34 shields the whole body gradient coil assembly 30 and the whole body RF coil 32 from view and protects them from damage.

Figure 2:
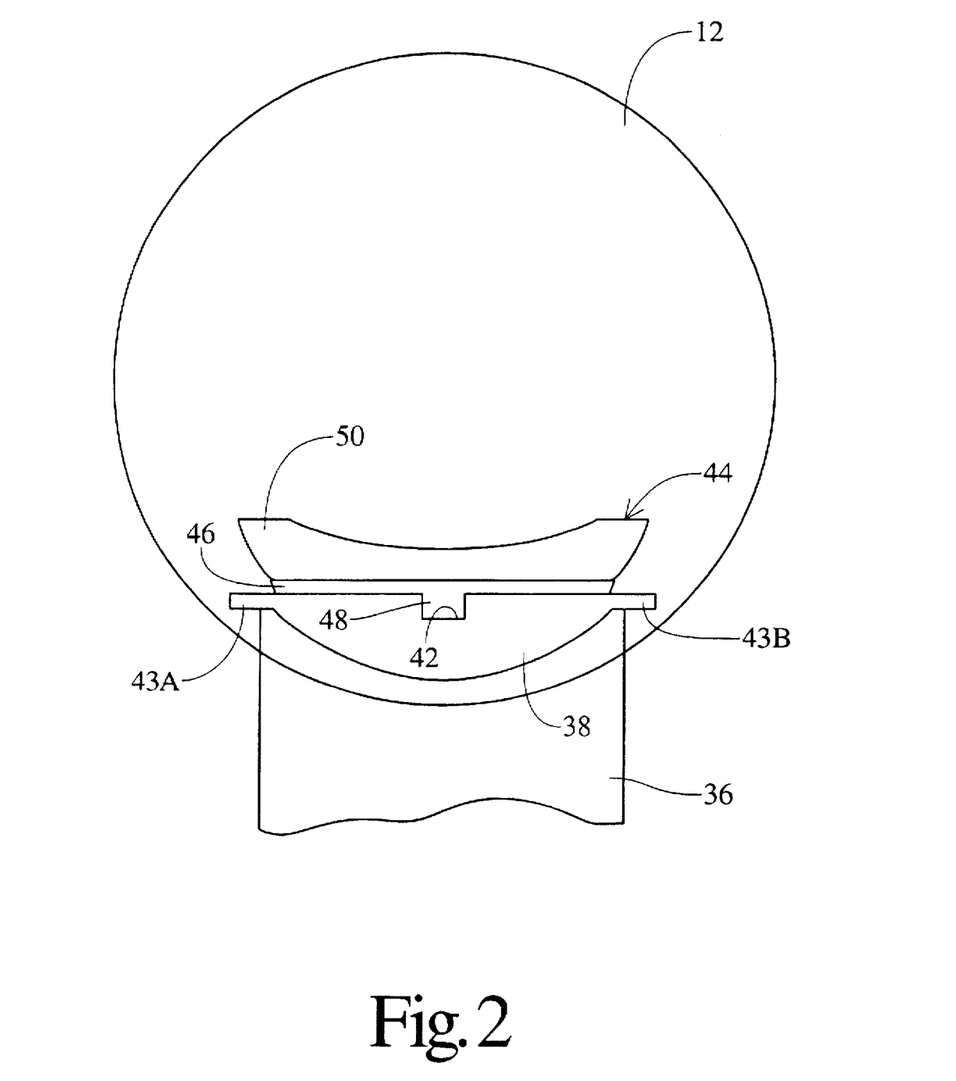
FIG. 2 is an end view of a patient couch and a patient beam of the MRI apparatus shown in FIG. 1.

With continuing reference to FIG. 1, and particular reference to FIG. 2, a patient table 36 is positioned adjacent the MRI apparatus A so as to extend from the bore 12 in a first direction substantially along the Z-axis. A patient beam 38 is secured to an upper surface of the patient table 36. The patient beam 38 extends longitudinally through the bore 12 and past the MRI apparatus A in an opposite direction along the Z-axis.

An end portion of the patient beam 38 defines a trolley storage area 40. In particular, the trolley storage area 40 includes at least a portion of the patient beam 38 which extends outside of the bore 12 remote from the patient table 36. The patient beam 38 includes a track or groove 42 extending longitudinally along a central portion thereof. The patient beam 38 also includes first and second flanges 43A, 43B defining longitudinally extending end edges of the patient beam 38.

4

A patient couch 44 is slidably secured to the patient beam 38 for back and forth movement along the Z-axis. More particularly, the patient couch 44 includes a base portion 46 having a guide or key member 48 which is constrained within the track 42. The key member 48 and track 42 cooperate to permit movement of the patient couch 44 along the Z-axis and prevent movement of the patient couch 44 along the X axis. A cushion 50 is secured to the base portion 46 for supporting a patient lying on the patient couch 44.

The patient couch 44 also includes a coupler 52. The coupler 52 selectively couples to or engages with an insert gradient coil assembly 54 to permit the patient couch 44 to drivingly position the insert gradient coil assembly 54 at isocenter within the bore 12. The coupler 52 also permits the patient couch 44 to drive the insert gradient coil assembly 54 to the trolley storage area 40 of the patient beam 38 when not in use.

Figure 3:
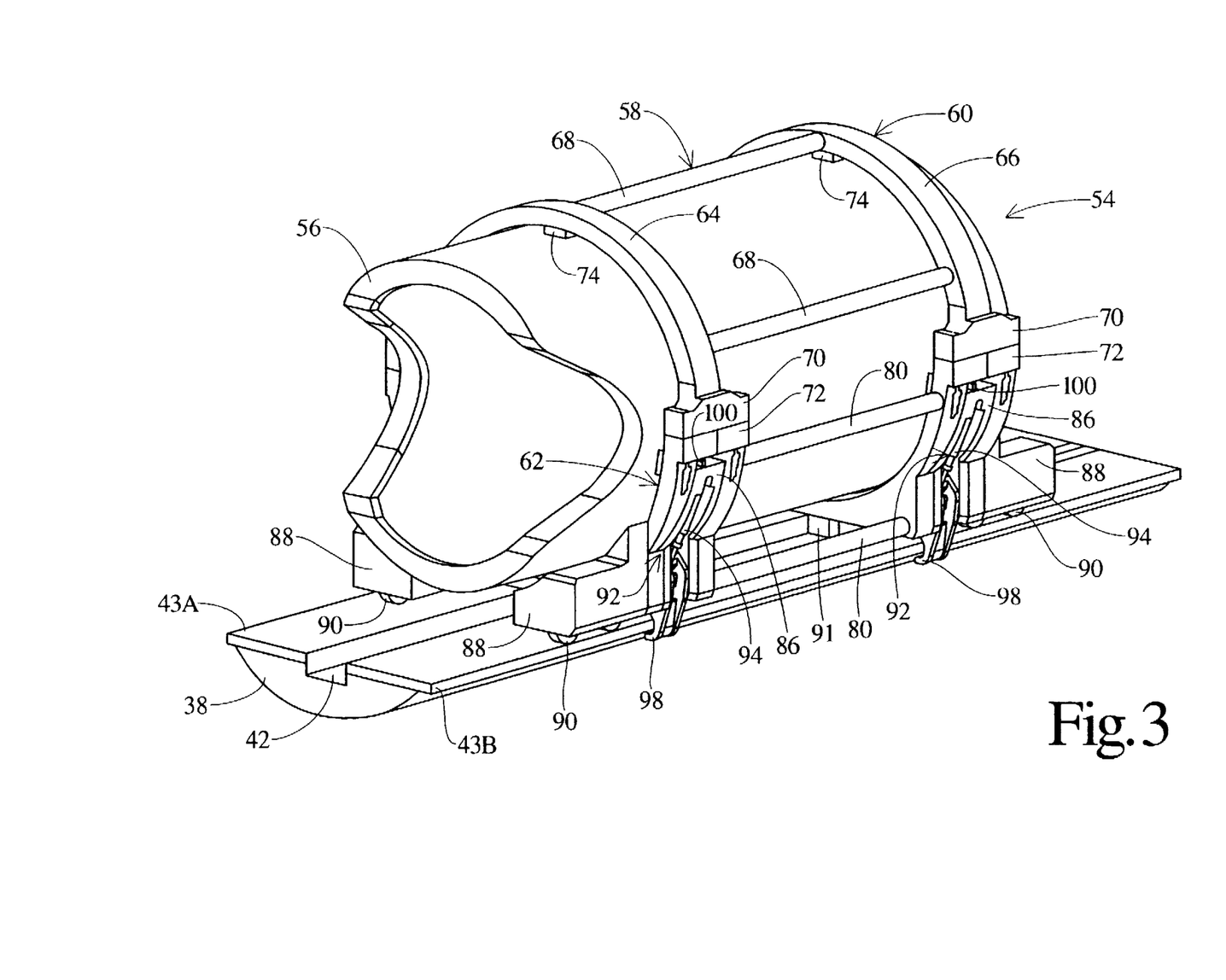
FIG. 3 is a perspective view of a trolley cage latched to the patient beam shown in FIG. 2 and having an exemplary insert gradient coil constrained therein.
Figure 4:
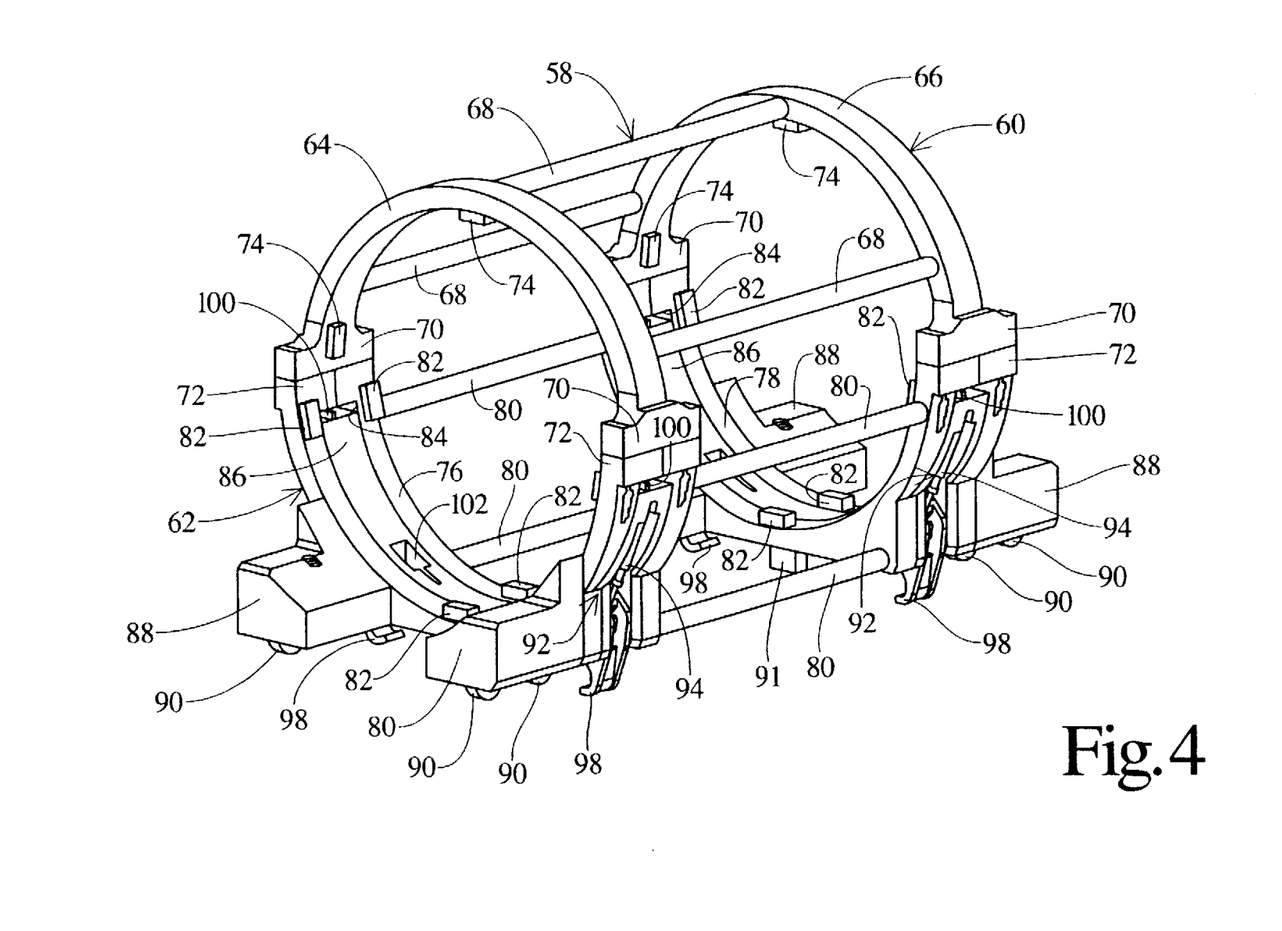
FIG. 4 is a perspective view of the trolley cage shown in FIG. 3 without the insert gradient coil constrained therein.

With continuing reference to FIG. 1 and particular reference to FIGS. 3 and 4, the insert gradient coil assembly 54 includes an insert gradient coil 56 and a trolley cage 58. The insert gradient coil 56 includes an X-gradient coil, Y-gradient coil, and Z-gradient coil (not shown) which cooperate with an insert RF coil (not shown) to provide spacial encoding of an NMR signal in a known manner. The insert RF coil is preferably integrated within a radially inner surface of the insert gradient coil 56.

The trolley cage 58 includes an upper cage assembly 60 and a lower cage assembly 62 which cooperate to constrain the insert gradient coil 56 therebetween as described further below. The upper cage assembly 60 includes a first upper frame member 64, a second upper frame member 66, and a number of upper rungs 68 extending transversely between and secured to the spaced-apart upper frame members 64, 66. The upper frame members 64, 66 are generally arcuate so as to conform substantially to a circularly cylindrical or other shaped outer surface of the insert gradient coil 56.

The upper frame members 64, 66 each include flanged end portions 70 for mating with mutually opposing flanged end portions 72 of the lower cage assembly 62. In particular, the flanged end portions 70, 72 are removably secured together with screws, bolts, or the like, so that the insert gradient coil 56 may be removed and replace when desired. A minimum number of brass, stainless steel, aluminum, or composition bolts or screws are used to secure the upper and lower cage assemblies 60, 62 together so as to prevent or at least minimize image artifacts resulting from the trace ferrous content of such bolts or screws.

A number of vibration dampeners 74 are secured to the radially inner or lower surfaces of the upper frame members 64, 66. The vibration dampeners damp any vibrations and noise that may be generated by the insert gradient coil 56 from coupling to the trolley cage 58 during scans.

The lower cage assembly 62 includes a first lower frame member 76, a second lower frame member 78, and a number of lower rungs 80 extending transversely between and secured to the spaced-apart lower frame members 76, 78. As with the upper frame members 64, 66, the lower frame members 76, 78 conform substantially to the outer surface of the insert gradient coil 56. A number of additional vibration dampeners 82 are secured to the radially inner or upper surfaces of the lower frame members 76, 78 for preventing vibrations and noise generated by the insert gradient coil 56 from coupling to the trolley cage 58.

The first and second lower frame members 76, 78 each include an aperture 84 which slidably receives a centering hoop 86. The lower frame members 76, 78 also include pairs of mutually opposing wheel support members 88 extending axially from remote end surfaces of the respective lower frame members 76, 78. Each of the wheel support members 88 support one or more wheels or sets of wheels 90 therein. The wheels 90 are spaced-apart along the X-axis of the MRI apparatus A so that they roll upon the patient beam 38. In the embodiment being described, each of the wheel support members 88 supports a single pair of wheels 90. However, it should be appreciated that the number of wheels could be increased for heavier insert gradient coils and decreased for lighter insert gradient coils.

When the insert gradient coil 56 is secured to the trolley cage 58, the first and second lower frame members 76, 78 bear substantially all of the weight of the insert gradient coil 56. That is, the centering hoops 86 may be spaced apart from and below the insert gradient coil 56 when positioned on the lower frame members 76, 78. The centering hoops 86 provide means for mechanically (and electrically) centering the insert gradient coil 56 relative to the MRI apparatus A, and means for locking the trolley cage 58 to the patient beam 38 as described further below.

The centering hoops 86 each include a guide member or key 91 which extends downward into the track 42 when the insert gradient coil assembly 54 is properly positioned on the patient beam 38. The guide members 91 and the track 42 cooperate to constrain the insert gradient coil assembly 54 to movement along the Z-axis only.

The centering hoops 86 further include pairs of pneumatically-driven latching mechanisms 92 disposed on opposing exterior side surfaces thereof. The latching mechanisms 92 permit the trolley cage 58 to latch to or engage the flanges 43A, 43B of the patient beam 38 once the insert gradient coil assembly 54 is positioned at isocenter by the patient couch 44. The patient couch 44 is typically driven in both directions along the patient beam 38 by a horizontal drive motor (not shown).

The latching mechanisms 92 each include a pneumatic or air cylinder 94, pneumatic switch or valve 96 (FIG. 5), and a latch assembly 98. The pneumatic cylinder 94 is mechanically linked to the latch assembly 98. The latch assembly 98 remains in an unlocked or raised position as long as the insert gradient coil 56 is not positioned at isocenter. When actuated, as shown in FIGS. 3 and 4, the pneumatic cylinder 94 drives the latch assembly 98 into a latched state and mechanically actuates the pneumatic switch 96.

Figure 5:
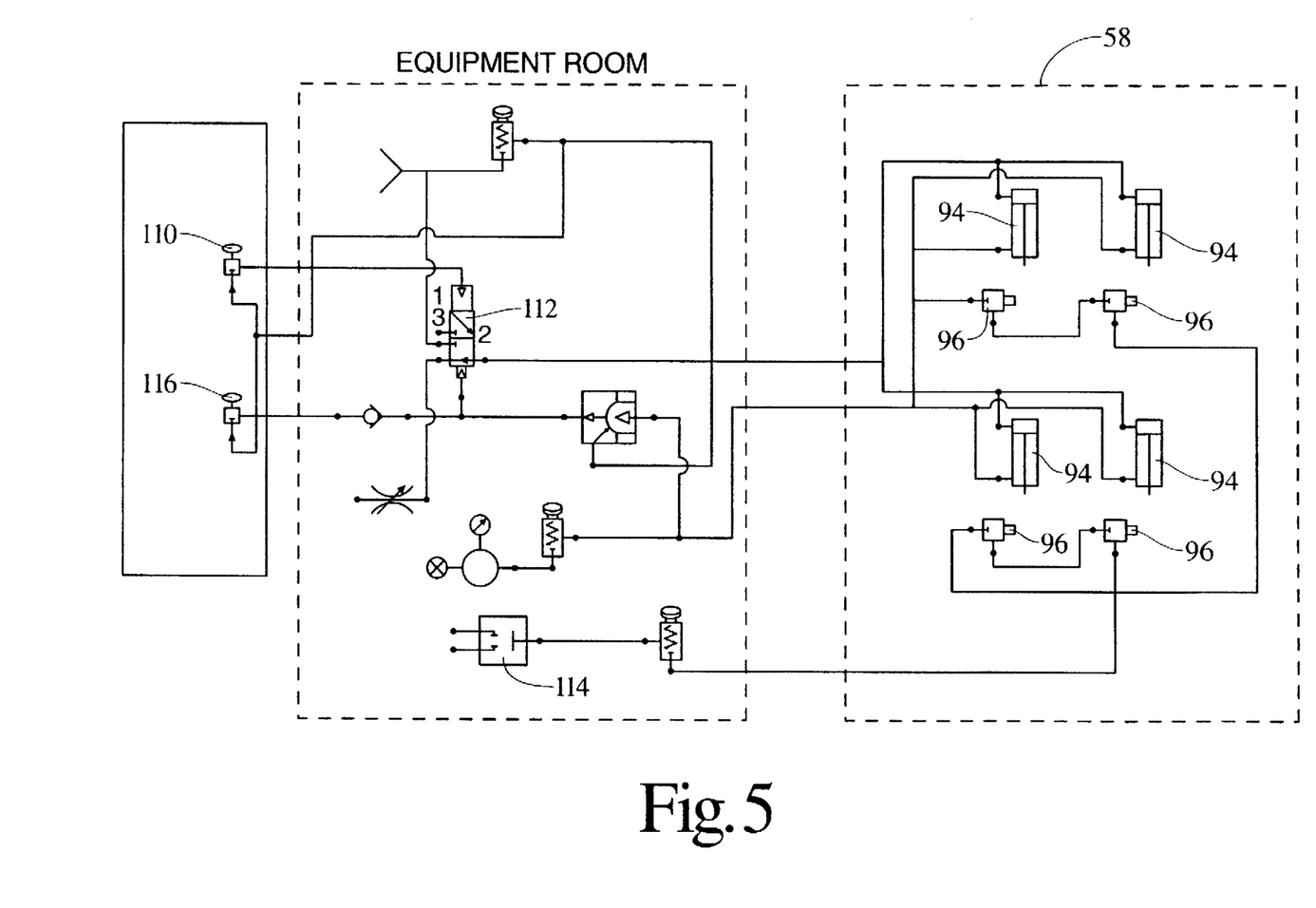
FIG. 5 is a schematic diagram of a pneumatic interlock system for latching the trolley cage to the patient beam as shown in FIG. 2.

The pneumatic switch or spool valve 96 is only activated or opened by the full extension of the cylinders 94 in a fully latched state of the latch assembly 98 to indicate that the latch assembly 98 is properly positioned around the flanges 43A, 43B of the patient beam 38. The latches 98 are formed from a non-ferrous material such as aluminum so as to prevent or minimize image artifacts resulting from the trace ferrous content the latches 98. Alternatively, the latches 98 could be constructed from stainless steel, brass, or any other non-ferrous metal or rigid composite.

It should be appreciated that the latches 98 prevent the trolley cage 58, and therefore the insert gradient coil 56, from moving in the vertical (Y) direction or to the lateral (X) direction. These constraints insure safe operation of a torque balanced insert gradient coil. The failure of a half-coil (i.e., a half X or Y- gradient coil) could cause the insert gradient coil 56 to exhibit a net torque which could result in a turning movement of the insert gradient coil 56. Serious bodily harm could result to a patient being scanned if such a failure were to occur. Thus, the latches 98 are a safety feature in case of an insert gradient coil failure.

It should also be appreciated that the number of latches 98 and their associated cylinders 94 could be increased or decreased. For instance, the number of latches 94 could be increased to six or eight to provide additional security. The number of cylinders 94 would likewise be increased to match the number of latches 98. The number of latches 98 could likewise be decreased.

The centering hoops 86 further include centering mechanisms for permitting service and installation personnel to adjust or align the insert gradient coil 56 at isocenter during setup and calibration procedures. In particular, the centering mechanisms each include adjustment screws 100 for adjusting the vertical position of the upper and lower frame members 64, 66, 76, 78, and hence, the insert gradient coil 56 constrained therein, relative to the centering hoops 86 in a direction along the Y-axis. The screws 100 are extended (retracted) in pairs to raise and lower the upper and lower cage assemblies 60, 62 relative to the centering ring 86. If the pairs of screws 100 on opposite sides are adjusted in an opposite sense, the cage assemblies 60, 62 rotate relative to the centering hoops 86. Further, the centering mechanisms include set screws 102 for adjusting the lateral position of the upper and lower frame members 64, 66, 76, 78, and hence, the insert gradient coil 56 retained therein, relative to the centering hoops 86 in a direction along the X-axis. As screws 102 in the wells are turned in one sense, the cage assemblies 60, 62 are driven in the +X direction relative to the centering hoops; and when they are turned in the other direction, the cage assemblies 60, 62 are cammed in the −X direction relative to the centering hoops 86.

The trolley cage 58, and more particularly, the upper and lower frame members 64, 66, 76, 78, transverse rungs 68, 80, centering hoops 86, and wheel support members 88 are each machined or otherwise formed preferably from a phenolic material. Alternatively, the same trolley cage components could be made from fiberglass or other non-ferrous rigid material. However, it should be appreciated that if the trolley cage 58 were constructed from electrically conductive materials, it could be subject to the deleterious effects of eddy currents. The transverse rungs 68, 80 are secured to the respective upper and lower frame members 64, 66, 76, with an adhesive such as epoxy. Alternatively, the same trolley cage components may be secured together with non-ferrous bolts, screws, or the like.

In the illustrated embodiment, the trolley cage 58 includes five transversely extending rungs 68, 80 securing the upper and lower frame members 64, 66, 76, 78 together. However, it should be appreciated that the trolley cage 58 could be constructed from more or less rungs 68, 80. In the extreme case, the trolley cage 58 could be constructed not as a cage but, rather, as a solid constraining cover.

The operation of the present invention will now be discussed with continuing reference to FIGS. 1–4. As previously mentioned, when the insert gradient coil 56 is not in use, the insert gradient coil assembly 54 is positioned (driven) out of the bore 12 to the trolley storage area 40. When positioned in the trolley storage area 10, the insert gradient coil assembly 54 does not interfere with the normal operation of the patient couch 44, nor does it affect normal MR scanning operations (non-insert gradient mode of operation).

When the insert gradient coil 56 is to be used in a MR imaging procedure, a technician actuates the horizontal drive motor associated with the patient couch 44 so as to drive the patient couch 44, and hence the patient couch portion of the coupler 52 along the patient beam 38 into engaging contact with the trolley cage portion of the coupler 52. Once the patient couch 44 and the trolley cage 58 are coupled together via the coupler 52, the horizontal drive motor is again actuated so as to drive the patient couch 44 back out of the bore 12 to a patient loading position.

The insert gradient coil 56 extends at least partially out of the bore 12 when the patient couch 44 is in the patient loading position. As the trolley cage 58 is driven out past the front of the bore 12, the latches 98 are in an upward or unlocked position so as to avoid cosmetic panels (not shown) covering a portion of the patient beam 38 external to the bore 12. With a patient properly positioned within the insert gradient coil 56 on the patient couch 44, the patient couch 44 is driven so as to position the insert gradient coil 56 at isocenter within the bore 12.

With reference now to FIG. 5, a technician then activates a first pneumatic push button valve 110 which causes an operating medium such as air pressure to be coupled through a three-way valve 112 to inlet ports associated with each of the pneumatic cylinders 94. In response thereto, the pneumatic cylinders 94 drive their associated latches 98 into downward locking engagement with the flanges 43A, 43B of the patient beam 38. When the cylinders 94 are extended, and the latches 98 are locked into position, each latch 98 mechanically pushes a plunger associated with each of the pneumatic switches 96, thus opening the switches 96.

As shown in FIG. 5, the four pneumatic switches 96 (one at each cylinder 94) are connected in series. When all four pneumatic switches 96 are open, indicating that all four latches 98 are properly locked, regulated air pressure is coupled through the four switches 96 to a pneumatic electric switch 114. The regulated air pressure causes the pneumatic electric switch 114 located outside of the magnet room to close, allowing electrical current to flow, thereby enabling the MR scan system. A gradient amplifier system and an RF amplifier system (discussed further below) of the MRI apparatus A are interlocked so that neither can function when the latches 98 are not properly locked to the flanges 43A, 43B. It should be appreciated that any number of MRI systems could be interlocked together depending upon particular safety and security requirements.

Once the MR scan is completed, a second pneumatic push button valve 116 is activated to cause air pressure to be discharged from outlet ports of the pneumatic cylinders 94 back through the three-way valve 112. When the air pressure within the pneumatic cylinders 94 reaches a predetermined level, the cylinders 94 retract and disengage the latches 98 from the flanges 43A, 43B. The patient couch 44 is then driven back to the patient loading position so that the patient can be removed therefrom. The insert gradient coil assembly 54 is stored in the trolley storage area 40 by driving the patient couch 44 back through the bore 12. The coupler 52 is manually or remotely controlled to engage and disengage from the trolley cage 58.

Figure 6:
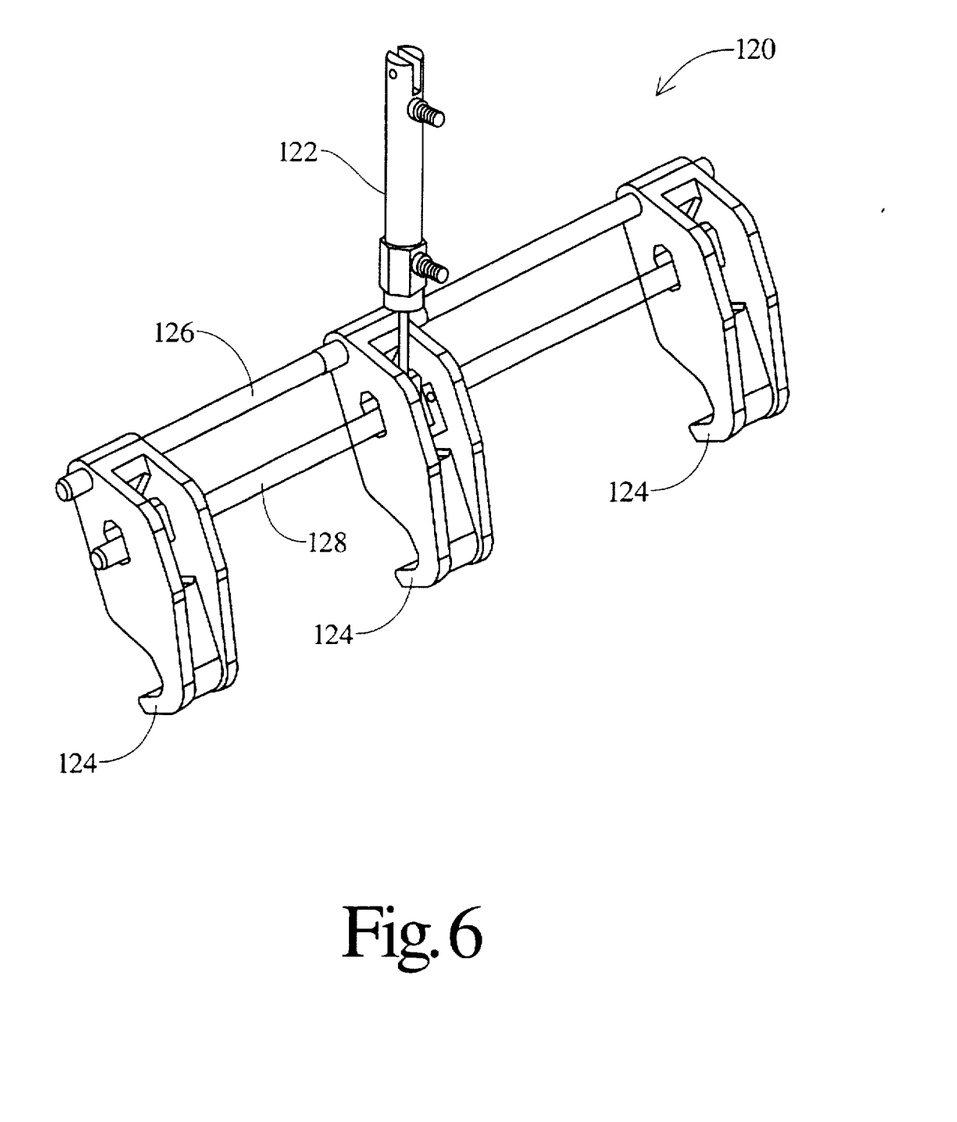
FIG. 6 is a perspective view of an alternate latch mechanism for the trolley cage shown in FIG. 2.

Referring now to FIG. 6, an alternate latching mechanism 120 latches the trolley cage 58 to the patient beam 38. One latching mechanism 120 is positioned on each side of the trolley cage 58 The latching mechanism 120 includes a single pneumatic air cylinder 122 for driving a number of latches 124 which are mechanically linked to the air cylinder 122 via a pivot bar 126 and a drive bar 128. One or more pneumatic switches or sensors (not shown) may be used to detect when the latches 124 are in a lowered and latched position. The latching mechanism 120 operates in a manner similar to the latching mechanisms 92 discussed above.

The latching mechanisms 92, 120 include latches 98, 124, respectively, which are driven into and out of locking engagement with the flanges 43A, 43B of the patient beam 38. Alternatively, the latches 98, 124 may lockingly engage a structure other than the patient beam 38. For instance, catch points may be provided on the whole body RF coil 32, whole body gradient coil 30, or main magnetic field coils 10 to permit the trolley cage 58 to latch thereto.

In addition, the latching mechanisms 92, 120 may be include an optical detector system in place of the pneumatic switches 96. In this embodiment, the latches 98, 124 interrupt an optical beam as long as they are in a non-latched position. When the latches 98, 124 are in a lowered and latched position, the optical beam is uninterrupted and the operation of the insert gradient coil is enabled. This embodiment could be realized by one or more optical fibers to transmit and receive the optical beam.

With reference again to FIG. 1, a gradient coil control 130 controls an array of gradient or current amplifiers 132 to supply current pulses appropriate to a selected sequence of the X, Y, and Z-gradient coils of the insert gradient coil 56, or the whole body gradient coil assembly 30. A switching means 134 selectively disconnects the current amplifiers 132 from the whole body gradient coil assembly 30 when the insert gradient coil assembly 54 is inserted into the bore 12. The switching means only connects the gradient amplifiers to the gradient windings of the insertable coil under control of the switches 96, 114.

A radio frequency transmitter 136 generates radio frequency signals which are conveyed by a switching means 138 through a quadrature splitter/combiner 140 to one of (1) the whole body RF coil 32 and (2) the insert RF coil. The switching means 138 also connects the selected one of the RF coils with a receiver 142 to supply received magnetic resonance signals thereto. The receiver 142, preferably a digital receiver, demodulates the magnetic resonance signals emanating from an examination region and produces a series of digital views or data lines.

An image reconstruction processor 144 performs a two-dimensional inverse Fourier transform or other conventional image reconstruction technique to reconstruct the plurality of views into an image representation which is stored in an image memory 146. The image memory 146 is connected with a video monitor 148 which selectively displays human-readable images of the image representations in the image memory 146.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

For instance, although it is intended that the insert gradient coil would be left inside the trolley cage 58, it is possible to have a plurality of interchangeable insert gradient coils 56 which would fit within the trolley cage 58 of the insert gradient coil assembly 54.

Having thus described the preferred embodiment, the invention is now claimed:

1. A magnetic resonance imaging apparatus including a main field magnet which generates a magnetic field through an examination region, a patient couch guide beam extending through the examination region, an insert gradient and radio coil assembly mounted in a trolley cage for selective placement in the examination region, the trolley cage comprising:

a cage assembly secured to an exterior surface portion of the insert gradient and radio coil assembly;

a plurality of wheels mounted to said cage assembly, said wheels rollingly contacting the patient couch guide beam such that the trolley cage rolls along the patient couch guide beam;

a latching mechanism for selectively locking said cage assembly to the patient couch guide beam when the trolley cage is positioned within the examination region; and an interlock device which enables the magnetic resonance imaging apparatus to commence an imaging procedure when said cage assembly is locked to the patient couch guide beam.

2. The magnetic resonance imaging apparatus of claim 1, wherein said cage assembly includes:

a lower cage assembly surrounding a first exterior surface portion of the insert gradient and radio coil assembly; and an upper cage assembly removably secured to said lower cage assembly and surrounding a second exterior surface portion of the insert gradient and radio coil assembly.

3. The magnetic resonance imaging apparatus of claim 2, wherein said lower cage assembly includes:

a frame member having an aperture therethrough;

a centering member positioned within said aperture, said centering member being connected with said latching mechanism such that said latching mechanism fixes a position of said centering member relative to the patient couch guide beam; and an adjustment mechanism for adjusting a position of said frame member relative to said centering member.

4. The magnetic resonance imaging apparatus of claim 3, wherein the patient couch guide beam includes a track and said centering member includes a key which cooperates with said track to constrain the trolley cage to movement only along the patient couch guide beam.

5. The magnetic resonance imaging apparatus of claim 1, further including:

a vibration dampener positioned between said cage assembly and said exterior surface portion of the insert gradient and radio coil assembly.

6. The magnetic resonance imaging apparatus of claim 1, wherein said cage assembly is formed from a phenolic material.

7. A magnetic resonance imaging apparatus including a main field magnet which generates a magnetic field through an examination region defined within a bore of the main field magnet, a patient couch guide beam extending through the examination region, an insert gradient coil assembly mounted to a trolley cage for selective placement in the examination region, the trolley cage comprising:

a cage assembly supporting the insert gradient coil assembly;

a plurality of rolling elements mounted to said cage assembly, said rolling elements rollingly contacting the patient couch guide beam such that the trolley cage rolls along the patient couch guide beam;

a latching mechanism for selectively locking said cage assembly to the patient couch guide beam when the trolley cage is positioned within the examination region; and a trolley storage area defined at a position along the patient couch guide beam exterior to the examination region, at least a portion of the trolley cage being positioned within said trolley storage area when not in use.

8. The magnetic resonance imaging apparatus of claim 7, further including:

a patient couch slidably secured to the patient couch guide beam;

a coupler assembly associated with said patient couch and the trolley cage for selectively coupling said patient couch with the trolley cage; and means for driving said patient couch along the patient couch guide beam, whereby when the trolley cage and said patient couch are coupled, said drive means positions the trolley cage and insert gradient coil assembly within the examination region and within said trolley storage area.

9. A magnetic resonance imaging apparatus including a main field magnet which generates a magnetic field through an examination region defined within a bore of the main field magnet, a patient couch guide beam extending through the examination region, an insert gradient coil assembly mounted to a trolley cage for selective placement in the examination region, the trolley case comprising:

a cage assembly supporting the insert gradient coil assembly;

a plurality of rolling members mounted to said cage assembly, said rolling members rollingly contacting the patient couch guide beam such that the trolley cage rolls along the patient couch guide beam; and a latching mechanism for selectively locking said cage assembly to the patient couch guide beam when the trolley cage is positioned within the examination region, said latching mechanism including:

a latch;

a cylinder linked between said cage assembly and said latch for driving said latch into locking engagement with the patient couch guide beam; and an indicator which indicates when said latch is locked to the patient couch guide beam.

10. The magnetic resonance imaging apparatus of claim 9, wherein said indicator includes:

a pneumatic switch which is mechanically actuated by said latch when driven into locking engagement with the patient couch guide beam to send to a pneumatic signal indicative of a completed latching operation.

11. A trolley cage for positioning an insert gradient coil along a guide beam in a bore of a magnetic resonance imaging apparatus, the trolley cage comprising:

a cage assembly for supporting the insert gradient coil;

a plurality of wheels secured to said cage assembly, the wheels rolling along the guide beam to facilitate movement of the trolley cage along the guide beam;

a latching mechanism for locking said cage assembly to the guide beam; and a control mechanism which controls the latching mechanism from a location remote from the bore of the magnetic resonance imaging apparatus to lock and unlock the trolley cage to the guide beam.

12. The trolley cage of claim 11, wherein the cage assembly includes:

a lower cage assembly surrounding a first exterior surface portion of the insert gradient coil; and an upper cage assembly removably secured to said lower cage assembly and surrounding a second exterior surface portion of the insert gradient coil.

13. The trolley cage of claim 12, wherein said lower cage assembly includes:

a frame member having an aperture therethrough;

a centering member positioned within said aperture, said centering member being connected with said latching mechanism such that said latching mechanism fixes a position of said centering member relative to the guide beam; and an adjustment mechanism for adjusting a position of said frame member relative to said centering member.

14. The trolley cage of claim 11, further including:

a vibration dampener positioned between said cage assembly and said exterior surface portion of the insert gradient coil.

15. A trolley cage for positioning an insert gradient coil along a guide beam in a bore of a magnetic resonance apparatus, the trolley cage comprising:

a cage assembly surrounding at least a portion of the insert gradient coil;

a plurality of wheels associated with said cage assembly, the wheels facilitating movement of the trolley cage along a guide beam; and a latching mechanism for locking said cage assembly to a guide beam, said latching mechanism including:
a latch;
a cylinder linked between said cage assembly and said latch for driving said latch into locking engagement with a guide beam; and
an indicator which indicates when said latch is locked to a guide beam.

16. The trolley cage of claim 15, wherein said indicator includes:

a pneumatic switch which is mechanically actuated by said latch being driven into locking engagement with the guide beam.

17. A method of positioning an insert coil carried in a trolley cage along a guide beam within an examination region in a bore of a magnetic resonance imaging apparatus, the method comprising:

coupling a patient couch to the trolley cage in a trolley store area of the guide beam remote from the examination region;

driving the patient couch and the coupled trolley cage along the guide beam to a patient loading/unloading position;

driving the patient couch and coupled trolley cage along the guide beam to position the trolley cage at a selected location within the examination region;

performing at least one magnetic resonance imaging operation;

driving the patient couch and the coupled trolley cage along the guide beam to the patient loading/unloading position;

driving the patient couch and the coupled trolley cage along the guide beam until the trolley cage is positioned in the trolley storage area; and decoupling the trolley cage from the patient couch.

18. The method of claim 17, further including:

locking the trolley cage to the patient beam when the trolley cage is positioned at the selected location within the examination region.

19. The method of claim 18, wherein the selected location within the examination region is a magnetic isocenter.

20. A method of positioning an insert gradient coil in an examination region of a magnetic resonance imaging apparatus, the apparatus having a guide beam extending through the examination region, the method comprising:

coupling a patient couch to a trolley cage stored on a portion of the guide beam exterior to the imaging apparatus, the trolley cage retaining the insert gradient coil;

driving the patient couch and the coupled trolley cage along the guide beam to a selected location within the examination region;

locking the trolley cage to the guide beam when the trolley cage is Positioned at the selected location;

generating a signal when the trolley cage is locked to the guide beam;

in response to the signal, enabling commencement of a magnetic resonance imaging operation; and decoupling the patient couch from the trolley cage after being driven to the portion of the guide beam exterior to the imaging apparatus.

* * * * *